United States Patent
Boerstler et al.

(10) Patent No.: US 7,360,135 B2
(45) Date of Patent: Apr. 15, 2008

(54) APPARATUS AND METHOD FOR AUTOMATICALLY SELF-CALIBRATING A DUTY CYCLE CIRCUIT FOR MAXIMUM CHIP PERFORMANCE

(75) Inventors: David W. Boerstler, Round Rock, TX (US); Eskinder Hailu, Austin, TX (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/848,314

(22) Filed: Aug. 31, 2007

(65) Prior Publication Data

US 2007/0300113 A1    Dec. 27, 2007

Related U.S. Application Data

(63) Continuation of application No. 11/242,677, filed on Oct. 4, 2005, now Pat. No. 7,322,001.

(51) Int. Cl.
 *G01R 31/28* (2006.01)
 *H03K 3/017* (2006.01)
(52) U.S. Cl. ...................... 714/733; 327/175
(58) Field of Classification Search ................ 714/733
 See application file for complete search history.

(56) References Cited

U.S. PATENT DOCUMENTS

| | | | |
|---|---|---|---|
| 5,757,218 A | 5/1998 | Blum | |
| 5,883,523 A | 3/1999 | Ferland et al. | |
| 6,363,507 B1 | 3/2002 | Truebenbach et al. | |
| 6,426,660 B1 | 7/2002 | Ho et al. | |
| 6,452,843 B1 | 9/2002 | Zheng et al. | |
| 6,466,071 B2 | 10/2002 | Kim et al. | |
| 6,509,766 B1 | 1/2003 | Pomichter et al. | |
| 6,518,809 B1* | 2/2003 | Kotra | 327/175 |
| 6,535,986 B1 | 3/2003 | Rosno et al. | |
| 6,583,657 B1 | 6/2003 | Eckhardt et al. | |
| 6,680,637 B2 | 1/2004 | Seo | |
| 6,717,877 B2* | 4/2004 | Suzuki et al. | 365/210 |

(Continued)

FOREIGN PATENT DOCUMENTS

EP     1146644 A2     10/2001

(Continued)

*Primary Examiner*—James C. Kerveros
(74) *Attorney, Agent, or Firm*—Francis Lammes; Stephen J. Walder, Jr.; D'Ann N. Rifai

(57) ABSTRACT

An apparatus and method for automatically calibrating a duty cycle circuit for maximum performance. A chip level built-in circuit automatically calibrates the duty cycle correction (DCC) circuit setting for each chip. The chip level built-in circuit includes a clock generation macro unit, a simple duty cycle correction (DCC) circuit, an array slice and built-in self test unit, and a DCC circuit controller. A built-in self test provides results, i.e. pass or fail, of an array to the DCC circuit controller. If the result of the built-in self test is a pass, then the current DCC circuit controller's DCC control bit setting is set as the setting for the chip. If the result from the built-in self test is a fail, the DCC circuit controller's DCC control bits setting is incremented to a next setting and the self-test is performed again.

23 Claims, 3 Drawing Sheets

U.S. PATENT DOCUMENTS

| | | |
|---|---|---|
| 6,750,689 B2 | 6/2004 | Fletcher et al. |
| 6,844,766 B2 | 1/2005 | Sun |
| 6,960,952 B2 | 11/2005 | Nguyen et al. |
| 7,181,658 B2 | 2/2007 | Ito |
| 7,225,092 B2 | 5/2007 | Boerstler et al. |
| 2002/0140478 A1 | 10/2002 | Fletcher et al. |
| 2003/0112046 A1 | 6/2003 | Atallah et al. |
| 2004/0075462 A1 | 4/2004 | Kizer et al. |
| 2004/0108878 A1 | 6/2004 | Dosho et al. |
| 2004/0189364 A1 | 9/2004 | Lee et al. |
| 2005/0007168 A1 | 1/2005 | Park et al. |
| 2007/0079197 A1 | 4/2007 | Boerstler et al. |

FOREIGN PATENT DOCUMENTS

| | | |
|---|---|---|
| EP | 1139569 B1 | 12/2004 |

\* cited by examiner

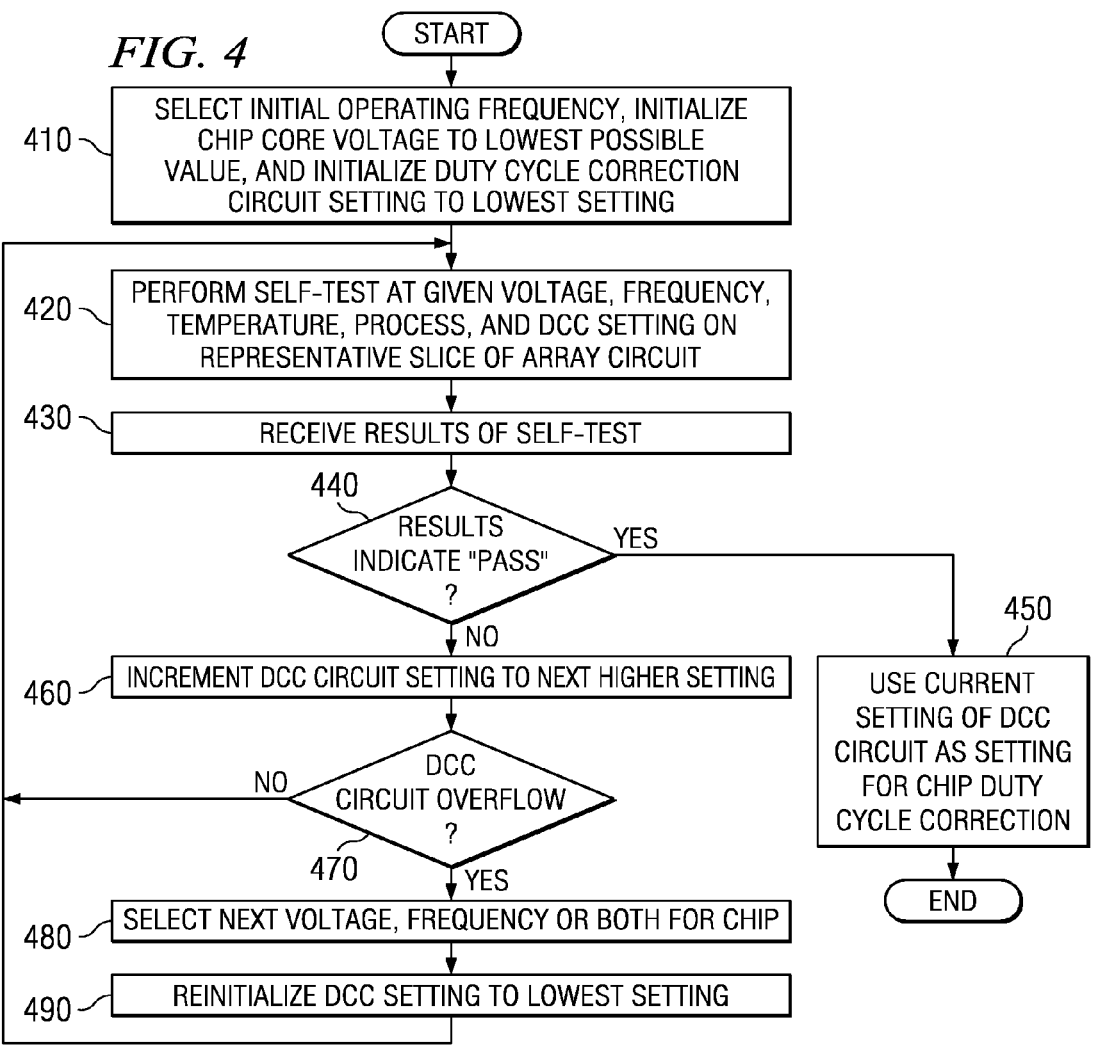
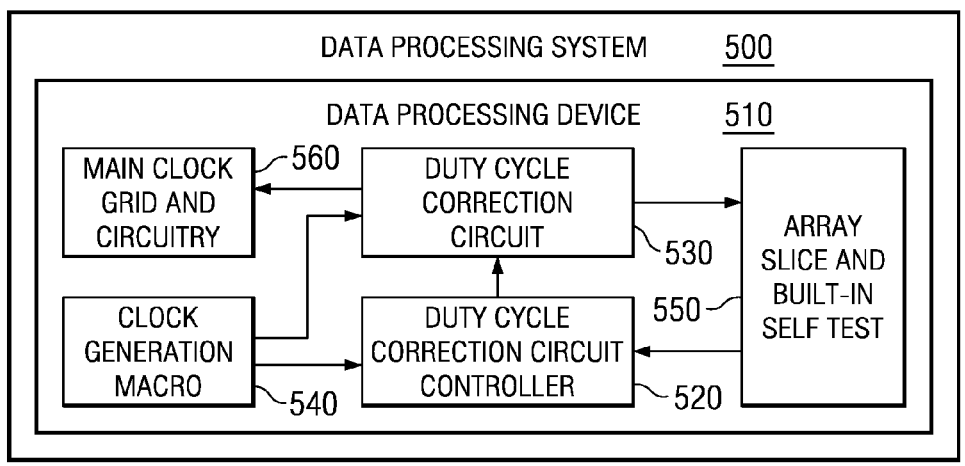

APPARATUS AND METHOD FOR AUTOMATICALLY SELF-CALIBRATING A DUTY CYCLE CIRCUIT FOR MAXIMUM CHIP PERFORMANCE

This application is a continuation of application Ser. No. 11/242,677, filed Oct. 4, 2005, status pending.

BACKGROUND OF THE INVENTION

1. Technical Field

The present invention relates generally to an improved integrated circuit apparatus and method. More specifically, the present invention is directed to an apparatus and method for automatically self-calibrating a duty cycle circuit for maximum chip performance.

2. Description of Related Art

The speed at which modern integrated circuit devices operate has been greatly increasing in recent years. It is often necessary to operate such high speed integrated circuit devices in synchronization with a system clock signal that is at a duty cycle, i.e. the ratio of pulse duration to a pulse period, of approximately 50% (a 50/50 duty cycle). Thus, when a clock signal having a duty cycle that is greater than or less than 50% is provided as an input, the integrated circuit device may not perform very well. Duty cycle correction circuits have been developed to address this problem.

Various mechanisms have been devised for providing duty cycle correction circuits. For example, U.S. Patent Application Publications 2002/0140478, 2004/0189364, 2004/0108878, 2004/0075462, 2005/0007168 and U.S. Pat. Nos. 6,844,766; 6,750,689; 6,680,637; 6,583,657; 6,466,071; 6,426,660; and 5,757,218 all describe various circuits for duty cycle correction. In addition, European patents EP1139569B1 and EP1146644A2 and U.S. patent application Ser. No. 10/970,284 describe other types of duty cycle correction circuitry. However, all of these circuits are targeted at achieving a fixed duty cycle value for all conditions, e.g., a 50% duty cycle.

Having a fixed duty cycle may not necessarily result in optimal operating conditions for an integrated circuit device. For example, for optimal performance at a lowered voltage, arrays may need a non-50% duty cycle and may actually need a varying duty cycle. That is, because operational conditions may change, e.g., process (e.g., doping, threshold voltage, mobility, gate oxide thickness, etc. variations across a single wafer and across multiple wafers), voltage, temperature, frequency, etc., a fixed duty cycle may not lead to the optimal performance of the integrated circuit device under all conditions.

SUMMARY OF THE INVENTION

The present invention provides a mechanism for automatically calibrating a duty cycle circuit for maximum performance. The mechanism of the present invention provides for automatic self-calibration of the duty cycle circuit that may dynamically calibrate the duty cycle under various operating conditions.

A duty cycle correction (DCC) circuit is, by design, sensitive to the process used to manufacture the chip, the voltage at which the chip operates, and the temperature at which the chip operates. Under prior art mechanisms, each chip, or a few chips from the same process lot, would need to be characterized to obtain the best DCC circuit setting for the entire process lot. As a result, the DCC circuit operates at the same setting regardless of the particular operating conditions of the particular chip and, as a result, optimum operation of the chip may not be achieved.

The mechanism of the present invention, on the other hand, provides a chip level built-in circuit that automatically calibrates the duty cycle correction (DCC) circuit setting for each chip. This chip level built-in circuit includes a clock generation macro unit, a simple duty cycle correction (DCC) circuit, an array slice and built-in self test unit, and a DCC circuit controller. The DCC circuit may be comprised of a plurality of stages for incrementally changing the duty cycle for a given frequency of operation. The DCC circuit controller includes an AND gate for ANDing results from a built-in self test of the array slice and built-in self test unit, a counter, a thermometric decoder, a counter overflow detector, and an operating characteristic selector unit.

In operation, an initial operating frequency is selected and the chip core voltage is initialized to its lowest possible value. The DCC correction circuit is initialized to its lowest setting and a self-test, at a given voltage, frequency, temperate, process, and DCC setting is performed on a representative slice of the array circuit, i.e. on the array slice and built-in self test unit. The results of the built-in self test, i.e. pass or fail, are provided to the DCC circuit controller. If the result of the built-in self test is a pass, then the current DCC circuit controller's DCC control bit setting is set as the setting for the chip. The DCC control bits identify which stages of the DCC circuit are enabled and thus, what the duty cycle is for the chip.

If the result from the built-in self test is a fail, the DCC circuit controller's DCC control bits setting, and thus, the DCC circuit's setting, is incremented to a next setting and the self-test is performed again. This process is repeated until the built-in self test indicates a pass result. If a DCC circuit controller setting overflow occurs, i.e. the DCC circuit controller is incremented through all of its settings but the results of the built-in self test still indicate a failure, the chip core voltage is then incremented to its next higher increment or the operating frequency is reduced to its next lower increment, or both. In such a case, the DCC circuit is reinitialized and the process described above is repeated for the new chip core voltage and/or operating frequency.

This process may be performed periodically, continuously, or upon the occurrence of a particular event, e.g., a power-on event, a change in an operating characteristic such as voltage, temperature, etc., or the like. The process and mechanism of the present invention automatically selects a best duty cycle setting for a duty cycle correction circuit so that the chip can have optimum performance at a given process, voltage, and temperature (PVT) condition. The process and mechanism of the present invention greatly reduces test and characterization time and cost that would be needed in determining a best DCC circuit setting since it is no longer necessary to use an external test environment to perform such characterization. The dynamic nature of the circuit also allows for the chip to select the best duty cycle setting even when the chip level operating environment changes due to work load variations and PVT variations.

In one exemplary embodiment of the present invention, an apparatus is provided that may comprise a duty cycle correction (DCC) circuit, a DCC circuit controller coupled to the DCC circuit, an array coupled to the DCC circuit, and a built-in self test circuit coupled to the array and the DCC circuit controller. The built-in self test circuit may perform a self test on the array using a current setting of the DCC circuit. The DCC circuit controller may increment a setting of the DCC circuit to a next incremental setting in response to a result from the built-in self test circuit indicating a failure of the array. The DCC circuit controller may set the current setting of the DCC circuit as a DCC setting for a chip in response to a result from the built-in self test circuit indicating a pass of the array.

The DCC circuit may comprise a plurality of stages, each stage in the plurality of stages providing an incremental change to a duty cycle of the array when enabled. Each stage in the plurality of stages is individually able to be enabled based on an input from the DCC circuit controller. Each stage in the plurality of stages may comprise at least one amplifier and at least one switch coupled to the at least one amplifier. The at least one switch may be controlled by the input from the DCC circuit controller.

The DCC circuit controller may comprise a counter and a decoder coupled to the counter. The counter may receive, as an input, a signal indicative of whether the result of the self test is that the self test passed or failed, and may increment when the input signal indicates that the self test failed. A counter value signal may be output to the decoder. The decoder may receive the counter value signal from the counter, generate a control signal based on the counter value signal, and output the control signal to the DCC circuit. Furthermore, the decoder may be a thermometric decoder.

The DCC circuit controller may further comprise an AND gate that receives as inputs, a first signal from the built-in self test circuit that indicates whether the self test passed or failed, and a second signal that is a clock signal that drives the counter. The DCC circuit controller may also comprise a counter overflow detector coupled to the N-bit counter. The counter overflow detector may detect when a counter overflow condition occurs and reinitializes the counter when the counter overflow condition occurs.

The DCC circuit controller may also comprise a chip operational characteristic selector coupled to the counter overflow detector. When a counter overflow condition occurs, the counter overflow detector may send an overflow signal to the chip operational characteristic selector. The chip operational characteristic selector may select a new operational characteristic for the chip in response to receiving the overflow signal. The new operational characteristic may be at least one of an operational voltage or an operational frequency. Selecting the new operational characteristic may include at least one of incrementing the operational voltage to a next higher operational voltage or incrementing the operational frequency to a next lower operational frequency.

The DCC circuit may be initially set at a lowest setting and may be incremented to a next higher setting each time the built-in self test circuit indicates a failure of self test applied to the array until a maximum setting of the DCC circuit is reached at which point at least one of an operational voltage or an operational frequency is modified and the DCC circuit is reinitialized.

The apparatus may be part of a system-on-a-chip. The system-on-a-chip may be part of a data processing system. The data processing system may be one of a desktop data processing system, a server, a portable data processing system, a laptop data processing system, a notebook data processing system, a personal digital assistant, a gaming device, a gaming console, a portable telephone device, or a communication device. The apparatus may be part of a multiprocessor system-on-a-chip having at least two heterogeneous processors.

In a further embodiment of the present invention, a duty cycle correction (DCC) circuit controller is provided. The DCC circuit controller may comprise a counter and a decoder coupled to the counter. The counter may receive an input signal indicative of whether a result of a self test indicates that the self test passed or failed, may increment when the input signal indicates that the self test failed, and may output a counter value signal to the decoder. The decoder may receive the counter value signal from the counter, generate a control signal based on the counter value signal, and output the control signal to a duty cycle correction (DCC) circuit. The DCC circuit may incrementally change a duty cycle based on the control signal output by the decoder. The decoder may be a thermometric decoder.

The DCC circuit controller may further comprise an AND gate that receives as inputs, a first signal from the built-in self test circuit that indicates whether the self test passed or failed, and a second signal that is a clock signal that drives the counter. The DCC circuit controller may also comprise a counter overflow detector coupled to the N-bit counter, wherein the counter overflow detector detects when a counter overflow condition occurs and reinitializes the counter when the counter overflow condition occurs.

The DCC circuit controller may also comprise a chip operational characteristic selector coupled to the counter overflow detector. When a counter overflow condition occurs, the counter overflow detector may send an overflow signal to the chip operational characteristic selector. The chip operational characteristic selector may select a new operational characteristic for the chip in response to receiving the overflow signal. The new operational characteristic may be at least one of an operational voltage or an operational frequency, and wherein selecting a new operational characteristic includes at least one of incrementing the operational voltage to a next higher operational voltage or incrementing the operational frequency to a next lower operational frequency.

The DCC circuit controller may be part of a system-on-a-chip. The system-on-a-chip may be part of a data processing system. The data processing system may be one of a desktop data processing system, a server, a portable data processing system, a laptop data processing system, a notebook data processing system, a personal digital assistant, a gaming device, a gaming console, a portable telephone device, or a communication device. The DCC circuit controller may be part of a multiprocessor system-on-a-chip having at least two heterogeneous processors.

In addition to the above, the present invention provides a method, in a data processing device, comprising selecting an initial operating frequency for the data processing device, initializing an operational voltage for the data processing device to a lowest possible voltage value, and initializing a duty cycle correction (DCC) device setting to a lowest DCC setting. The method may further comprise performing a test on an element of the data processing device, determining whether to modify the DCC device setting based on results of performing the test, and modifying the DCC device setting if it is determined that the DCC device setting is to be modified.

The data processing device may be an integrated circuit device, and the method may be implemented in an on-chip duty cycle correction device. The element of the data processing device may be a portion of an array on the integrated circuit device.

Performing a test on an element of the data processing device may comprise using a built-in self test circuit coupled to the portion of an array to perform a self test of the portion of the array at a current operational voltage, operational frequency, and DCC device setting. Determining whether to modify the DCC device setting based on results of performing the test may comprise determining if the results of performing the test indicate that the test passed or failed and incrementing the DCC device setting to a next incremental setting of the DCC device if the results of performing the test indicate that the test failed. If the results of performing the tests indicate that the test passed, a current setting of the DCC device may be used as a setting for duty cycle correction in the data processing device.

The method may further comprise determining if modifying the DCC device setting results in an overflow condition. One or more of the operational voltage and the operational frequency may be incremented if modification of the DCC device setting results in an overflow condition.

Moreover, the present invention provides a method for providing a duty cycle correction device in which a duty cycle correction (DCC) circuit, DCC circuit controller coupled to the DCC circuit, an array coupled to the DCC circuit, and a built-in self test circuit coupled to the array and the DCC circuit controller are provided. The built-in self test circuit may perform a self test on the array using a current setting of the DCC circuit. The DCC circuit controller may increment a setting of the DCC circuit to a next incremental setting in response to a result from the built-in self test circuit indicating a failure of the array. The DCC circuit controller may set the current setting of the DCC circuit as a DCC setting for a chip in response to a result from the built-in self test circuit indicating a pass of the array.

Furthermore, the present invention provides a method for providing a DCC control circuit in which a counter and a decoder coupled to the counter are provided. The counter may receive an input signal indicative of whether a result of a self test indicates that the self test passed or failed, may increment when the input signal indicates that the self test failed, and may output a counter value signal to the decoder. The decoder may receive the counter value signal from the counter, generate a control signal based on the counter value signal, and output the control signal to a duty cycle correction (DCC) circuit. The DCC circuit may incrementally change a duty cycle based on the control signal output by the decoder.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 4 is a flowchart outlining an exemplary operation for controlling the setting of a duty cycle correction circuit in accordance with on exemplary embodiment of the present invention; and FIG. 5 is an exemplary block diagram of a data processing system in which the duty cycle correction circuit controller of the present invention may be implemented.

DETAILED DESCRIPTION OF THE PREFERRED EMBODIMENTS

The present invention provides an on-chip integrated circuit apparatus and method for automatically controlling a duty cycle correction circuit so as to achieve optimum operation of a chip under various operating conditions. The overall target for chip performance is to have the highest possible operating frequency at a lowest possible operating voltage in order to reduce power. The present invention seeks to achieve such an optimal chip performance through the automatic on-chip control of the duty cycle correction circuit.

Figure 1:
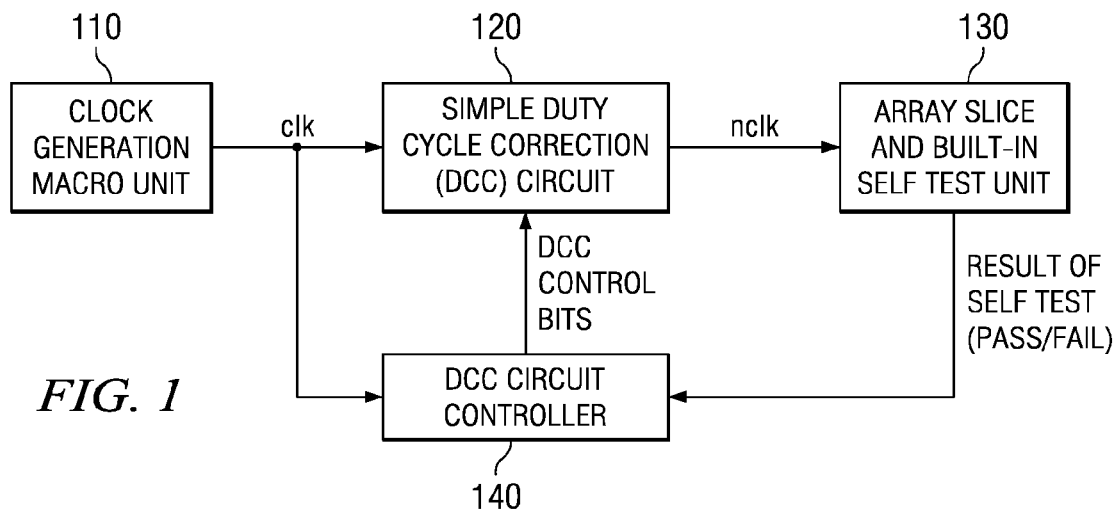
FIG. 1 is an exemplary block diagram of a circuit architecture in accordance with one exemplary embodiment of the present invention.

FIG. 1 is an exemplary block diagram of a circuit architecture in accordance with one exemplary embodiment of the present invention. As shown in FIG. 1, the circuit architecture includes a clock generation macro unit 110, a simple duty cycle correction (DCC) circuit 120, an array slice and built-in self test unit 130, and a DCC circuit controller 140. The clock generation macro unit 110, which in one exemplary embodiment is a phase-locked loop (PLL) circuit that is controllable such that it can output a clock signal of a desired frequency, generates an input clock signal to the DCC circuit 120. The DCC circuit 120 samples the input clock signal and performs duty cycle correction on the clock signal in accordance with the DCC circuit's current setting. The DDC circuit's current setting is controlled by the DCC control bit output from DCC circuit controller 140.

The DCC circuit 120 provides incremental changes to the input clock signal based on a current setting of the DCC circuit 120. For example, in one exemplary embodiment of the present invention, the DCC circuit 120 is comprised of a plurality of stages wherein the input clock signal is amplified by each enabled stage. Thus, each stage provides an incremental amplification to the input clock signal and, as a result, an output clock signal nclk is provided to array slice and built-in self test unit 130.

The array slice and built-in self test unit 130 is comprised of a small array grid, which is representative of the main array block, and a built-in self test circuit. Built-in self test circuits for arrays are generally known in the art and thus, a detailed description will not be provided herein. The built-in self test circuit subjects the array slice to self-test conditions and outputs a result of the test. For example, the built-in self test circuit may write data to the array slice, read data from the array slice, and compare the two to determine if the data written to the array slice matches the data read from the array slice. If there is a match, then the test passes. If there is no match, then the test fails. If the duty cycle for the input clock signal nclk is not properly aligned, then the data written to the array slice will not match the data read from the array slice and a test failure will result.

In other words, a simple array test may be provided as follows. At a given voltage, frequency, temperature, etc., a predetermined set of values is written to the representative array slice. This set of stored values may then be read from the array slice. If the values that are read from the array slice are different from the values that were to be written to the array slice, then the test has failed. In such a case, the operating conditions of the circuit will have to be changed to make the array functional, i.e. the read values equal to the written values.

The result, i.e. "pass" or "fail," generated by the built-in self test circuit in the array slice and built-in self test unit 130 is output to the DCC circuit controller 140. The DCC circuit controller 140 operates to set DCC control bits that are output to the DCC circuit 120 to thereby control the operation of the DCC circuit 120, e.g., identify which stages of the DCC circuit 120 are to be enabled. If the result signal input to the DCC circuit controller 140 indicates a "pass" result, then the current DCC setting is used as the setting for the chip. That is, no further testing and modification of the DCC circuit 120 is needed and the operation of the DCC circuit 120 is not modified from its current setting. If the result signal input to the DCC circuit controller 140 indicates a "fail" result, the DCC circuit controller generates DCC control bits for incrementing the DCC circuit 120 setting to a next setting and then the test operation described above is repeated.

Under certain conditions, it may be the case that the DCC circuit controller 140 causes all of the DCC circuit 120 settings to be incremented through and the result signal obtained from the array slice and built-in self test unit 130 still indicates a "fail" result. In such a case, the DCC circuit controller 140 provides control signals for incrementing the chip core voltage to its next higher increment or reduce the operating frequency to its next lower increment, or to do both. The DCC circuit 120 may then be reinitialized and the testing operation described above may commence with the new chip core voltage, frequency, or both.

In one exemplary embodiment of the present invention, the DCC circuit controller 140 increments the chip core voltage or reduces the operating frequency using a selector mechanism that selects the operating voltage and frequency. The frequency may be tied in to the clock generation macro unit 110 which may select the output frequency control for the circuit. The voltage may be selected by selecting the settings of a voltage regulator on the chip, for example. The operating voltage may also indirectly affect the clock frequency as well. These interdependencies are compensated for by the design of the selector mechanism and the settings from which the selector mechanism of the DCC circuit controller 140 may select.

Figure 2:
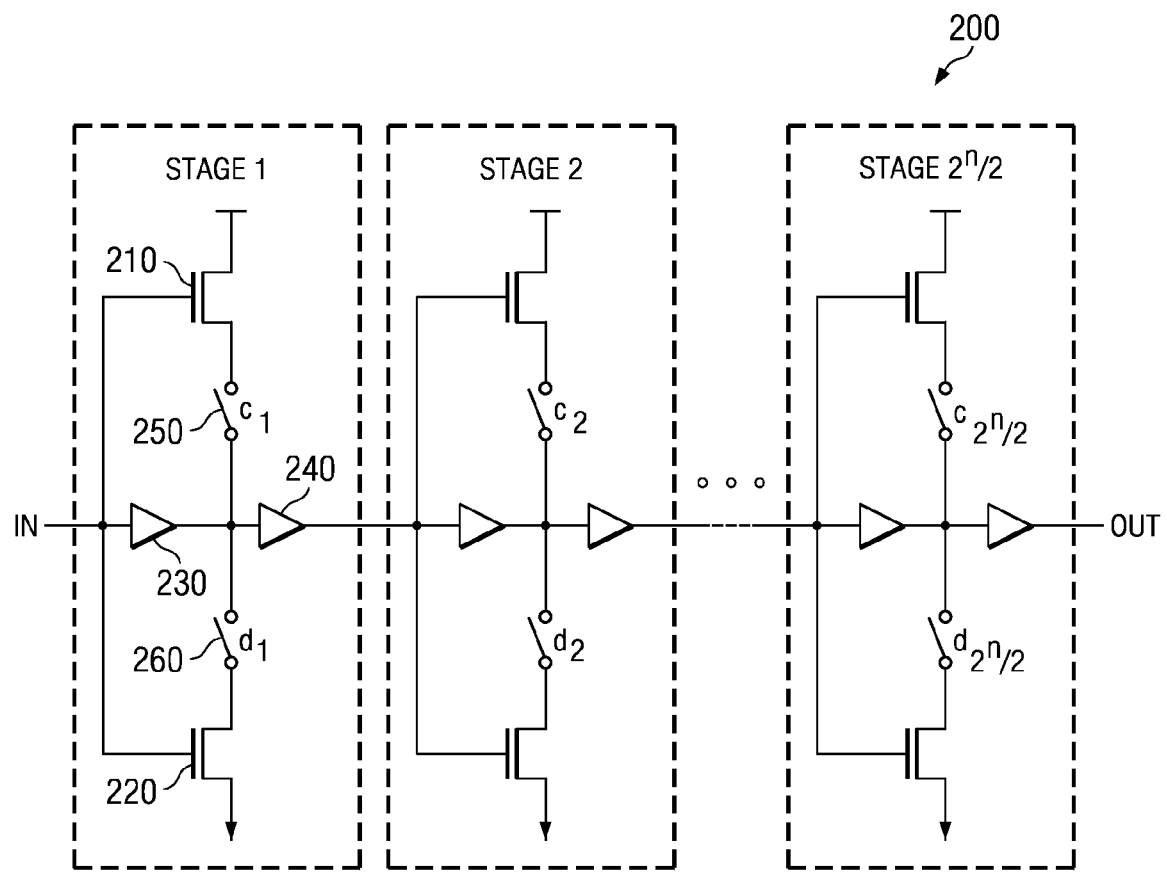
FIG. 2 is an exemplary diagram of a duty cycle correction circuit in accordance with one exemplary embodiment of the present invention.

FIG. 2 is an exemplary diagram of a duty cycle correction (DCC) circuit in accordance with one exemplary embodiment of the present invention. As shown in FIG. 2, the DCC circuit 200 includes a plurality of stages, e.g., stages 1 to $2^n/2$, where "n" is a number of increments for modifying the duty cycle. Each stage includes two small voltage sources 210 and 220, two amplifiers 230 and 240, and two switches 250 and 260. Based on the setting of the DCC control bits that are input to the DCC circuit from the DCC circuit controller, various ones of the switches 250 and 260 in each stage of the DCC circuit will be closed to thereby enabled the stage. When a stage is enabled, the amplifiers 230 and 240 in the stage serve to increase the duty cycle of the input clock signal by an incremental amount. Since the stages are provided in series, enabling a plurality of stages in series causes a cumulative incremental increase in duty cycle.

Thus, the DCC circuit 200 operates by varying the pull-down/up strengths of the inverters in every other stage. In this manner, the rise/fall time of the clock may be controlled. This results in a desired duty cycle output. While FIG. 2 shows one configuration of a DCC circuit 200, this configuration is only exemplary and is not intended to state or imply any limitation with regard to the types of DCC circuits with which the present invention may be implemented. To the contrary, many different types of DCC circuits are known and the mechanisms of the present invention may be used in conjunction with any known or later developed DCC circuit without departing from the spirit and scope of the present invention.

Figure 3:
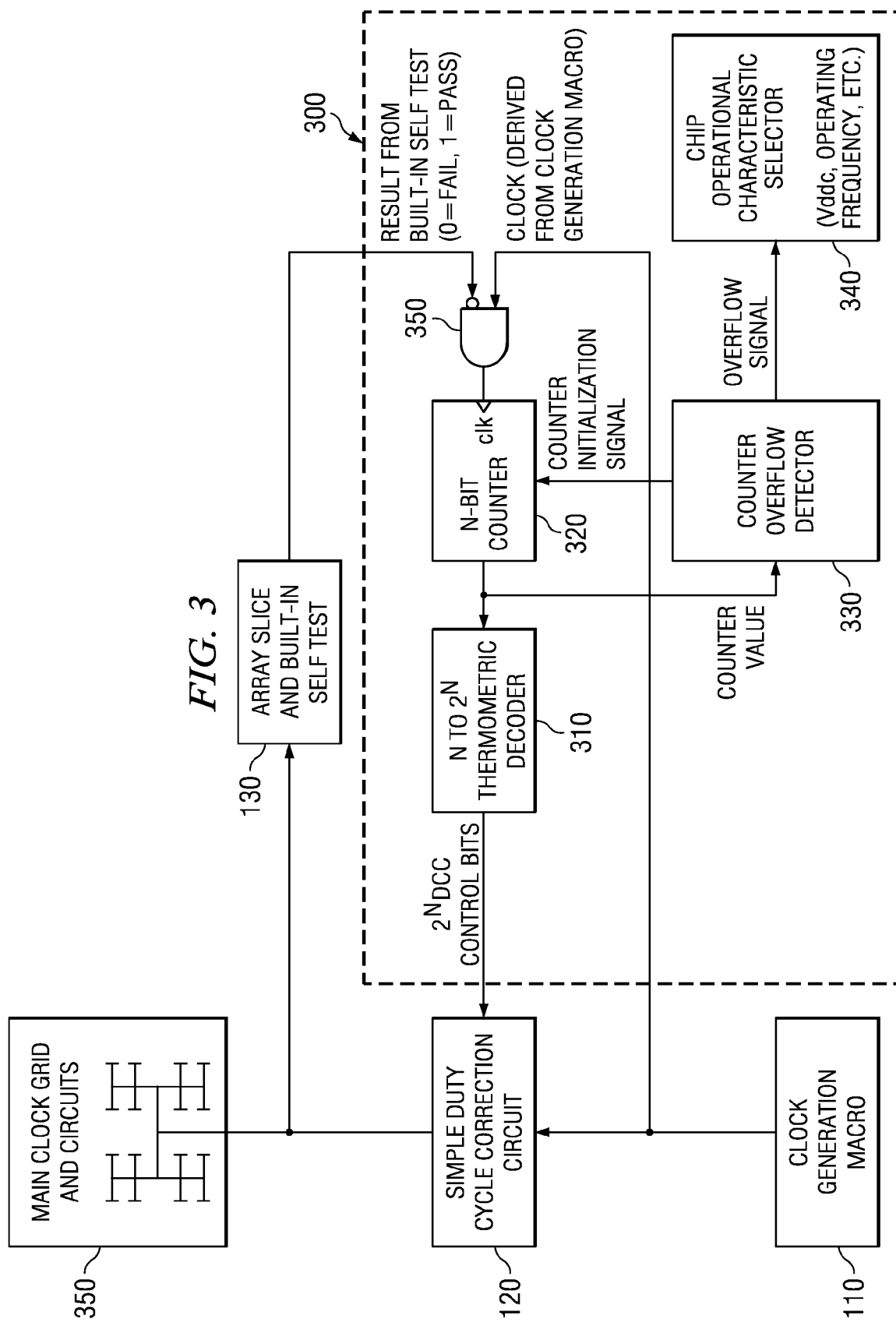
FIG. 3 is an exemplary diagram of a duty cycle correction circuit controller in accordance with one exemplary embodiment of the present invention.

FIG. 3 is an exemplary diagram of a duty cycle correction circuit (DCC) controller in accordance with one exemplary embodiment of the present invention. As shown in FIG. 3, the DCC circuit controller 300 includes a N to $2^N$ thermometric decoder 310, an N-bit counter 320, a counter overflow detector 330, a chip operational characteristic selector 340, and an AND gate 350. The AND gate 350 receives, as inputs, the result from the built-in self test of the array slice and built-in self test unit 130 and the clock signal derived from the clock generation macro unit 110. These two signals are AND'd together and the result is input to N-bit counter 320. The affect is that when the built-in self test indicates a failure, the output of the AND gate 350 is 0 at the next clock transition. As a result, the N-bit counter 320 increments to a next count and outputs a counter value to thermometric decoder 310 and counter overflow detector 330.

The thermometric decoder 310 converts the N-bit counter value generated by the N-bit counter 320 into a $2^N$ DCC control bit signal which is provided as an input to simple duty cycle correction circuit 120. The simple duty cycle correction circuit 120 performs duty cycle correction and provides an output to the main clock grid and circuits 350 and array slice and built-in self test unit 130.

The operation of a thermometric decoder is generally known in the art and thus, a detailed explanation is not provided herein. Essentially, all DCC control bits up to a current control bit identified by the N-bit counter value signal are set. As a result, when the DCC circuit receives the DCC control bits, all of the switches in the stages identified by the set DCC control bits are closed thereby enabling that stage's operation on the input clock signal. With each increment of the N-bit counter 320, another stage in the series of stages in the DCC circuit is enabled.

The counter overflow detector 330 also receives the counter value output signal from the N-bit counter 320 and determines whether a counter overflow condition has occurred. A counter overflow condition may be detected, for example, when the counter increments to a maximum value and then returns to an initial counter value, e.g., goes from a maximum counter value of 16 to a initial counter value of 1. In such a case, the counter overflow detector 330 outputs an overflow signal to chip operational characteristic selector 340 and outputs a counter initialization signal to N-bit counter 320. In response to receiving this counter initialization signal, the N-bit counter 320 reinitializes itself to a lowest count value.

In response to receiving the overflow signal, the chip operational characteristic selector 340 selects a next setting of the operational characteristics of the chip for use. For example, the chip operational characteristic selector 340 increments the voltage to a next higher voltage, increments the operational frequency to a next lower frequency, or both. This new operational characteristic is then used with the array slice and built-in self test unit to perform a next series of tests to determine an optimum combination of voltage, operational frequency, and duty cycle. That is, by virtue of the selection of the new operational characteristic and the reinitialization of the N-bit counter 320, the control of the DCC circuit is reinitialized for a new operational characteristic and the above operation for determining a proper duty cycle is repeated.

Thus, in operation, at power-on of the chip, for example, the N-bit counter 320 is initialized to a pre-determined value (for example, its lowest count setting). The N-bit counter 320 increments its values when there is a transition at its clock input clk. The chip is then started at a known operating voltage and frequency value. The result of the built-in self test is then AND'd with a clock that drives the N-bit counter 320. If the result from the built-in self test is "fail," i.e. the signal is low or 0, then on the next transition of the clk input of the N-bit counter 320, the N-bit counter 320 increments its value to its next level. This counter value is then transmitted to the thermometric decoder 310 as the DCC circuit setting. The thermometric decoder 310 generates the DCC control bits for controlling the DCC circuit based on the counter value. The DCC control bits will result in an incremental change on the duty cycle available for the chip at the given voltage and frequency.

The built-in self test is then carried out again with this new duty cycle setting. If the result of the built-in self test is a "fail", the counter is incremented again and its value used to modify the duty cycle in the manner previously described. This process continues until the built-in self test results in a "pass." In this case, the N-bit counter 320 will not longer increment its values and the DCC circuit will retain its current setting.

As mentioned above, under severe operating conditions, the N-bit counter 320 may count through its entire range and the built-in self test may fail for all the DCC settings. In this case, the overflow detector 330 will detect the overflow and output a signal to the selector 340 to instruct the selector 340 to increment the voltage, frequency or both. The above process is then repeated in order to find the optimal DCC setting for optimum chip performance.

FIG. 4 is a flowchart outlining an exemplary operation for controlling the setting of a duty cycle correction circuit in accordance with on exemplary embodiment of the present invention. As shown in FIG. 4, the operation starts by selecting initial operating frequency, the chip core voltage is initialized to a lowest possible value, and the duty cycle correction circuit setting is initialized to a lowest setting (step 410). A self test of a representative slice of an array circuit is then performed at the given voltage, frequency, temperature, process and DCC setting (step 420). The results of the self test are received (step 430) and a determination is made as to whether the results indicate a "pass" (step 440). If the results indicate a "pass," the current setting of the DCC circuit is used as the setting for the chip duty cycle correction (step 450) and the operation terminates.

If the result from the self test do not indicate a "pass," i.e. the result is a "fail," then the DCC circuit setting is incremented to a next higher setting (step 460). A determination is made as to whether this incrementing of the DCC circuit setting results in an overflow (step 470). If not, the operation returns to step 420. If an overflow occurs, a next voltage, frequency or both are selected for the chip (step 480). The DCC setting is then reinitialized to its lowest setting (step 490) and the operation returns to step 420.

Thus, the present invention provides a mechanism by which an optimum duty cycle setting for a duty cycle correction circuit may be automatically selected so that a chip can have optimum performance at a give process, voltage and temperature (PVT) condition. The mechanism of the present invention greatly reduces test/characterization time and cost that would be needed if the best setting was to be characterized in an external test environment. The dynamic nature of the mechanism of the present invention also allows for the chip to select the optimum duty cycle setting even when the chip level operating environment changes due to work load variations and PVT variations.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to gaming consoles, handheld or portable computing devices, and other advanced non-portable computer products having a display, a keyboard or other input device, and a central processor.

FIG. 5 is an exemplary block diagram of a data processing system in which the duty cycle correction circuit controller of the present invention may be implemented. As shown in FIG. 5, the duty cycle correction circuit controller 520 is provided on or in a data processing device 510 in association with a duty cycle correction circuit 530, a clock generation macro 540, an array slice with built-in self test unit 550, and a main clock grid and circuitry 560. It should be noted that while the data processing device 510 is illustrated as having a single duty cycle correction circuit controller 520 coupled to the other elements 530-560, the present invention is not limited to such. Rather, multiple instances of the elements 520-560 may be provided in the data processing device 510 in accordance with the present invention.

As mentioned above, the data processing device 510 may be any of a number of different types of data processing devices. Such data processing devices include, but are not limited to, integrated circuit chips, multi-chip packages, motherboards, and the like. The data processing device 510 may be part of a larger data processing system or device 500. This larger data processing system or device 500 may be any type of device utilizing a data processing device 510 ranging from toys and other low-end applications to gaming devices, gaming consoles, handheld or portable computing devices, laptop computing devices, personal digital assistant computing devices, telephone devices or other communication devices, and other advanced non-portable computing devices, such as desktop computers, servers, or the like.

In one exemplary embodiment, the data processing system shown in FIG. 5 may be, for example, a system-on-a-chip. In one exemplary embodiment of the present invention, the data processing system in which the present invention is implemented is a CELL Broadband Engine (CBE) architecture based data processing system available from International Business Machines Corporation of Armonk, N.Y. The Cell Broadband Engine (CBE) architecture, implemented on a single chip, includes a plurality of heterogeneous processors, having different instruction sets that share a common memory and bus. For example, one heterogeneous processor may be a synergistic processing unit (SPU) having a vector instruction set and the other heterogeneous processor may be a PowerPC processor having a Reduced Instruction Set Computer (RISC) or other type of instruction set, both sharing the same memory space.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in an integrated circuit device, comprising:
   selecting an initial operating frequency for a data processing device;
   initializing an operational voltage for the data processing device to a lowest possible voltage value;
   initializing a duty cycle correction (DCC) device setting to a lowest DCC setting;
   performing a test on an array of the data processing device;
   determining whether to modify the DCC device setting based on results of performing the test; and
   modifying the DCC device setting if it is determined that the DCC device setting is to be modified, wherein the DCC device setting is modified if the test determines that data written to the array fails to match data read from the array.

2. The method of claim 1, wherein the data processing device is an integrated circuit device, and wherein the method is implemented in an on-chip duty cycle correction device.

3. The method of claim 2, wherein the array of the data processing device is a portion of an array on the integrated circuit device.

4. The method of claim 3, wherein performing a test the array of the data processing device comprises:
   using a built-in self test circuit coupled to the portion of an array to perform a self test of the portion of the array at a current operational voltage, operational frequency, and DCC device setting.

5. The method of claim 1, wherein determining whether to modify the DCC device setting based on results of performing the test comprises:
   determining if the results of performing the test indicate that the test passed or failed; and
   incrementing the DCC device setting to a next incremental setting of the DCC device if the results of performing the test indicate that the test failed.

6. The method of claim 5, wherein if the results of performing the tests indicate that the test passed, a current setting of the DCC device is used as a setting for duty cycle correction in the data processing device.

7. The method of claim 1, further comprising:
   determining if modifying the DCC device setting results in an overflow condition; and
   incrementing one or more of the operational voltage and the operational frequency if modification of the DCC device setting results in an overflow condition.

8. A method in an integrated circuit device, comprising:
   providing a duty cycle correction (DCC) circuit;
   providing a DCC circuit controller coupled to the DCC circuit;
   providing an array coupled to the DCC circuit; and
   providing a built-in self test circuit coupled to the array and the DCC circuit controller, wherein the built-in self test circuit performs a self test on the array using a current setting of the DCC circuit, the DCC circuit controller increments a setting of the DCC circuit to a next incremental setting in response to a result from the built-in self test circuit indicating a failure of the array, wherein the DCC circuit controller sets the current setting of the DCC circuit as a DCC setting for a chip in response to a result from the built-in self test circuit indicating a pass of the array, and wherein the failure of the array is determined by data that is written to the array failing to match data read from the array.

9. The method of claim 8, wherein the DCC circuit comprises a plurality of stages, each stage in the plurality of stages providing an incremental change to a duty cycle of the array when enabled, and wherein each stage in the plurality of stages is individually able to be enabled based on an input from the DCC circuit controller.

10. The method of claim 9, wherein each stage in the plurality of stages comprises:
    at least one amplifier; and
    at least one switch coupled to the at least one amplifier, wherein the at least one switch is controlled by the input from the DCC circuit controller.

11. The method of claim 8, wherein the DCC circuit controller comprises:
    a counter; and
    a decoder coupled to the counter, wherein:
    the counter receives, as an input, a signal indicative of whether the result of the self test is that the self test passed or failed, increments when the input signal indicates that the self test failed, and outputs a counter value signal to the decoder, and wherein:
    the decoder receives the counter value signal from the counter, generates a control signal based on the counter value signal, and outputs the control signal to the DCC circuit.

12. The method of claim 11, wherein the decoder is a thermometric decoder.

13. The method of claim 11, wherein the DCC circuit controller further comprises:
    an AND gate that receives as inputs, a first signal from the built-in self test circuit that indicates whether the self test passed or failed, and a second signal that is a clock signal that drives the counter.

14. The method of claim 11, wherein the DCC circuit controller further comprises:
    a counter overflow detector coupled to the counter, wherein the counter overflow detector detects when a counter overflow condition occurs and reinitializes the counter when the counter overflow condition occurs.

15. The method of claim 14, wherein the DCC circuit controller further comprises:
    a chip operational characteristic selector coupled to the counter overflow detector, wherein when a counter overflow condition occurs, the counter overflow detector sends an overflow signal to the chip operational characteristic selector, and wherein the chip operational characteristic selector selects a new operational characteristic for the chip in response to receiving the overflow signal.

16. The method of claim 15, wherein the new operational characteristic is at least one of an operational voltage or an operational frequency, and wherein selecting a new operational characteristic includes at least one of incrementing the operational voltage to a next higher operational voltage or incrementing the operational frequency to a next lower operational frequency.

17. The method of claim 8, wherein the DCC circuit initially is set at a lowest setting and is incremented to a next higher setting each time a built-in self-test circuit indicates a failure of the self test applied to the array until a maximum setting of the DCC circuit is reached at which point at least one of an operational voltage or an operational frequency is modified and the DCC circuit is reinitialized.

18. A method in an integrated circuit device, comprising:
providing a counter; and
providing a decoder coupled to the counter, wherein the counter:
receives an input signal indicative of whether a result of a self test of an array indicates that the self test of the array passed or failed,
increments when the input signal indicates that the self test of the array failed, and
outputs a counter value signal to the decoder, wherein the decoder:
receives the counter value signal from the counter,
generates a control signal based on the counter value signal, and
outputs the control signal to a duty cycle correction (DCC) circuit, wherein the DCC circuit incrementally changes a duty cycle based on the control signal output by the decoder and wherein the failure of the self test of the array is determined by data that is written to the array failing to match data read from the array.

19. The method of claim 18, wherein the decoder is a thermometric decoder.

20. The method of claim 18, further comprising:
providing an AND gate that receives as inputs, a first signal from a built-in self test circuit that indicates whether the self test of the array passed or failed, and a second signal that is a clock signal that drives the counter.

21. The method of claim 18, further comprising:
providing a counter overflow detector coupled to the counter, wherein the counter overflow detector detects when a counter overflow condition occurs and reinitializes the counter when the counter overflow condition occurs.

22. The method of claim 21, further comprising:
providing a chip operational characteristic selector coupled to the counter overflow detector, wherein when a counter overflow condition occurs, the counter overflow detector sends an overflow signal to the chip operational characteristic selector, and wherein the chip operational characteristic selector selects a new operational characteristic for the chip in response to receiving the overflow signal.

23. The method of claim 22, wherein the new operational characteristic is at least one of an operational voltage or an operational frequency, and wherein selecting a new operational characteristic includes at least one of incrementing the operational voltage to a next higher operational voltage or incrementing the operational frequency to a next lower operational frequency.

* * * * *